United States Patent
Hornung et al.

(10) Patent No.: US 9,245,755 B2
(45) Date of Patent: Jan. 26, 2016

(54) DEEP COLLECTOR VERTICAL BIPOLAR TRANSISTOR WITH ENHANCED GAIN

(71) Applicant: Texas Instruments Incorporated, Dallas, TX (US)

(72) Inventors: Brian E. Hornung, Richardson, TX (US); Xiang-Zheng Bo, Plano, TX (US); Amitava Chatterjee, Plano, TX (US); Alwin J. Tsao, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/575,552

(22) Filed: Dec. 18, 2014

(65) Prior Publication Data
US 2015/0187760 A1     Jul. 2, 2015

Related U.S. Application Data

(60) Provisional application No. 61/921,580, filed on Dec. 30, 2013.

(51) Int. Cl.
| | | |
|---|---|---|
| *H01L 27/07* | (2006.01) | |
| *H01L 21/265* | (2006.01) | |
| *H01L 29/732* | (2006.01) | |
| *H01L 29/66* | (2006.01) | |
| *H01L 29/08* | (2006.01) | |
| *H01L 21/8249* | (2006.01) | |
| *H01L 27/06* | (2006.01) | |
| *H01L 29/10* | (2006.01) | |
| *H01L 29/78* | (2006.01) | |

(52) U.S. Cl.
CPC .......... *H01L 21/265* (2013.01); *H01L 21/8249* (2013.01); *H01L 27/0623* (2013.01); *H01L 29/0821* (2013.01); *H01L 29/1083* (2013.01); *H01L 29/66272* (2013.01); *H01L 29/732* (2013.01); *H01L 21/2652* (2013.01); *H01L 29/6659* (2013.01); *H01L 29/7833* (2013.01)

(58) Field of Classification Search
USPC .......................................................... 257/76
See application file for complete search history.

(56) References Cited

U.S. PATENT DOCUMENTS

| | | | | |
|---|---|---|---|---|
| 5,943,564 | A * | 8/1999 | Chen ................... | H01L 21/8249 257/E21.696 |
| 6,610,262 | B1 * | 8/2003 | Peng ................... | H01L 27/0262 257/355 |
| 2003/0082882 | A1 * | 5/2003 | Babcock ............. | H01L 21/8222 438/309 |
| 2013/0032882 | A1 * | 2/2013 | Salcedo .............. | H01L 27/0262 257/355 |

* cited by examiner

*Primary Examiner* — Thao P Le
(74) *Attorney, Agent, or Firm* — Jacqueline J. Garner; Frank D. Cimino

(57) ABSTRACT

An integrated circuit and method having a deep collector vertical bipolar transistor with a first base tuning diffusion. A MOS transistor has a second base tuning diffusion. The first base tuning diffusion and the second base tuning diffusion are formed using the same implant.

13 Claims, 9 Drawing Sheets

1

DEEP COLLECTOR VERTICAL BIPOLAR TRANSISTOR WITH ENHANCED GAIN

CROSS-REFERENCE TO RELATED APPLICATIONS

This application claims the benefit of priority under U.S.C. §119(e) of U.S. Provisional Application 61/921,580 (Texas Instruments docket number TI-71021, filed Dec. 30, 2013), the contents of which are hereby incorporated by reference.

FILED OF INVENTION

This invention relates to the field of integrated circuits. More particularly, this invention relates to bipolar transistors in CMOS integrated circuits.

BACKGROUND

Although the majority of transistors in most integrated circuits are CMOS transistors, bipolar transistors may also be constructed in a complementary metal-oxide-semiconductor (CMOS) integrated circuit to take advantage of areas where bipolar transistors outperform MOS transistors. For example bipolar transistors have higher transconductance, higher output impedance and faster switching speed. Vertical bipolar transistors which may be formed when manufacturing a CMOS integrated circuit with no extra cost have the ability to sink larger currents per unit device area than MOS transistors.

In addition, vertical bipolar transistors may be useful as a linear circuit such as a temperature stable voltage regulator, a bandgap reference circuit, a low input offset circuit, and a feedback amplifier circuit When building vertical bipolar transistor using a CMOS integrated circuit manufacturing flow it is difficult to optimize bipolar transistor characteristics such as bipolar transistor gain (hfe) without incurring additional processing cost.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit and method having with a deep collector vertical bipolar transistor with a first base tuning diffusion. A MOS transistor has a second base tuning diffusion. The first base tuning diffusion and the second base tuning diffusion are formed using the same implant

DETAILED DESCRIPTION OF EXAMPLE EMBODIMENTS

Figure 1A:
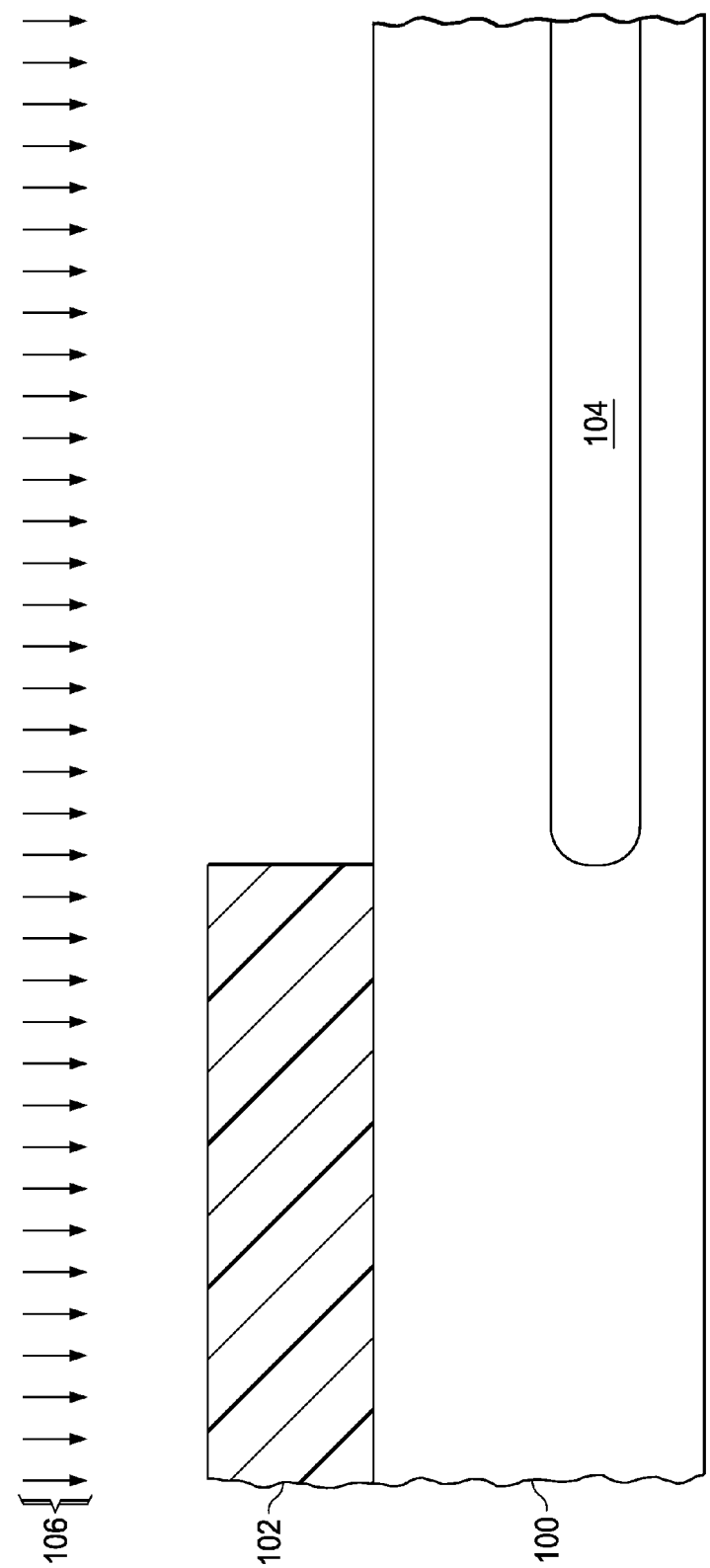
FIGS. 1A-1J are illustrations of steps in the fabrication of integrated circuits formed according to principles of the invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1B:
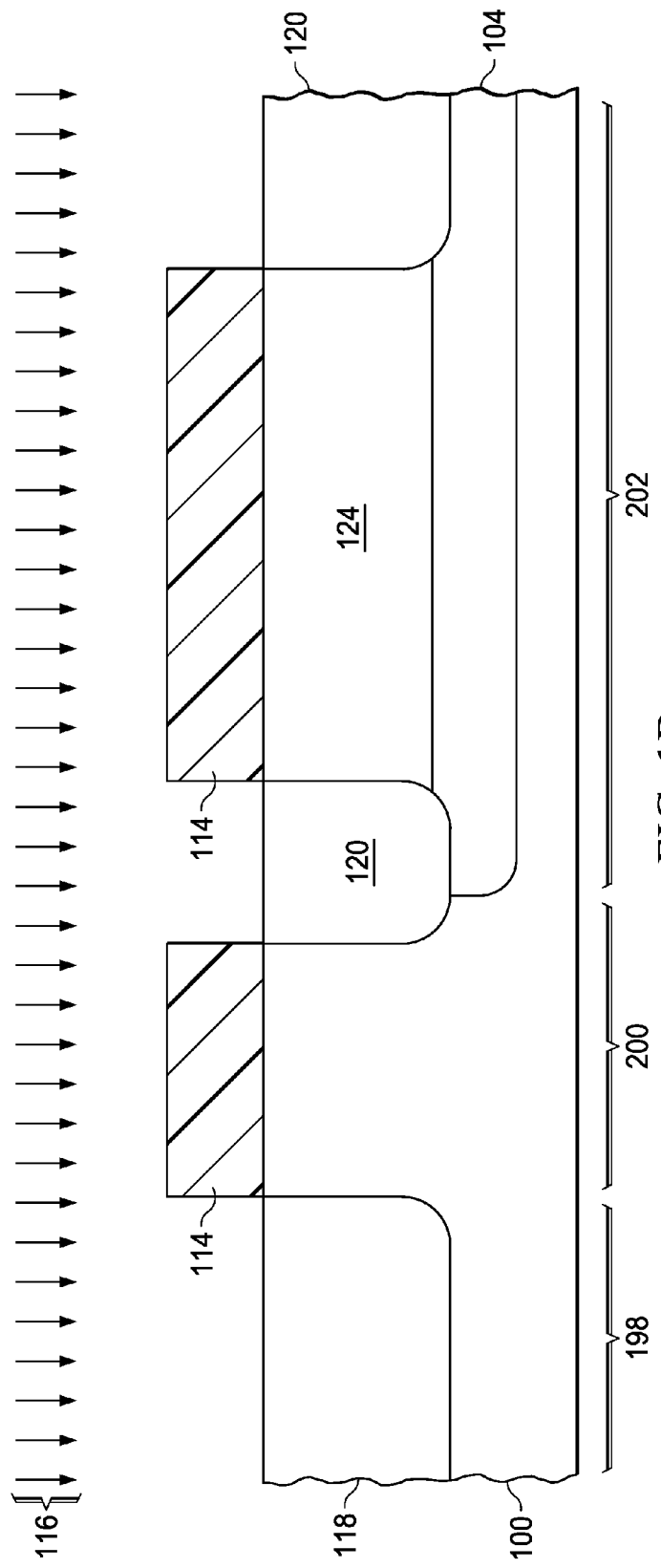
Figure 1C:
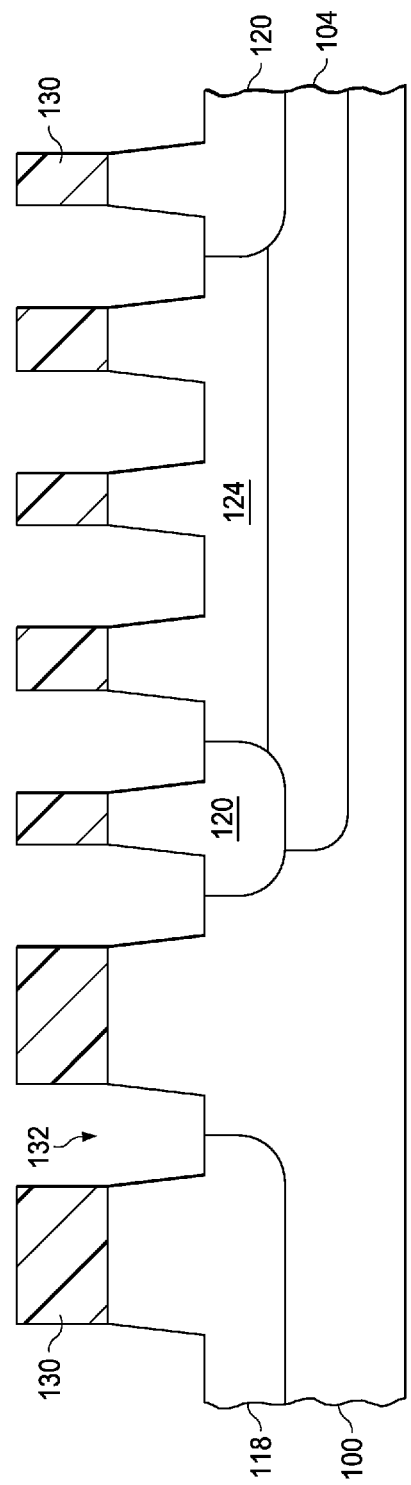
Figure 1D:
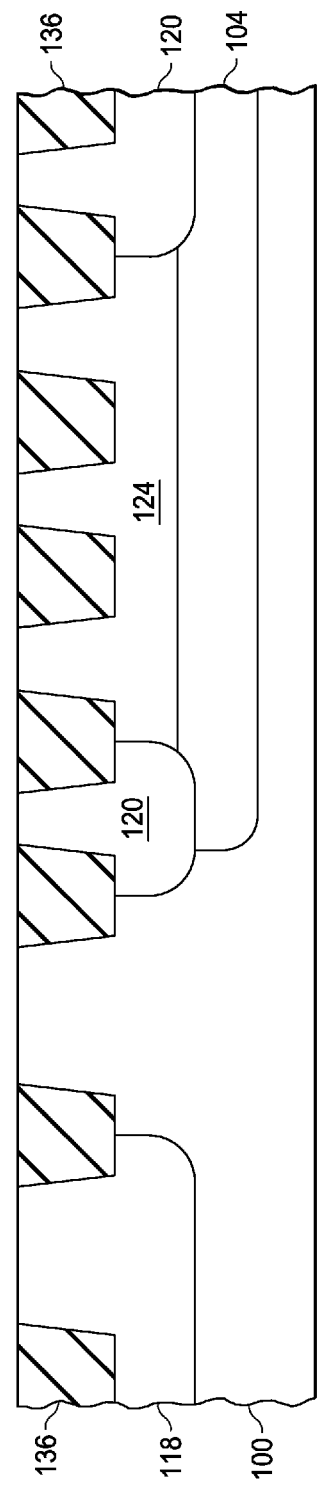
Figure 1E:
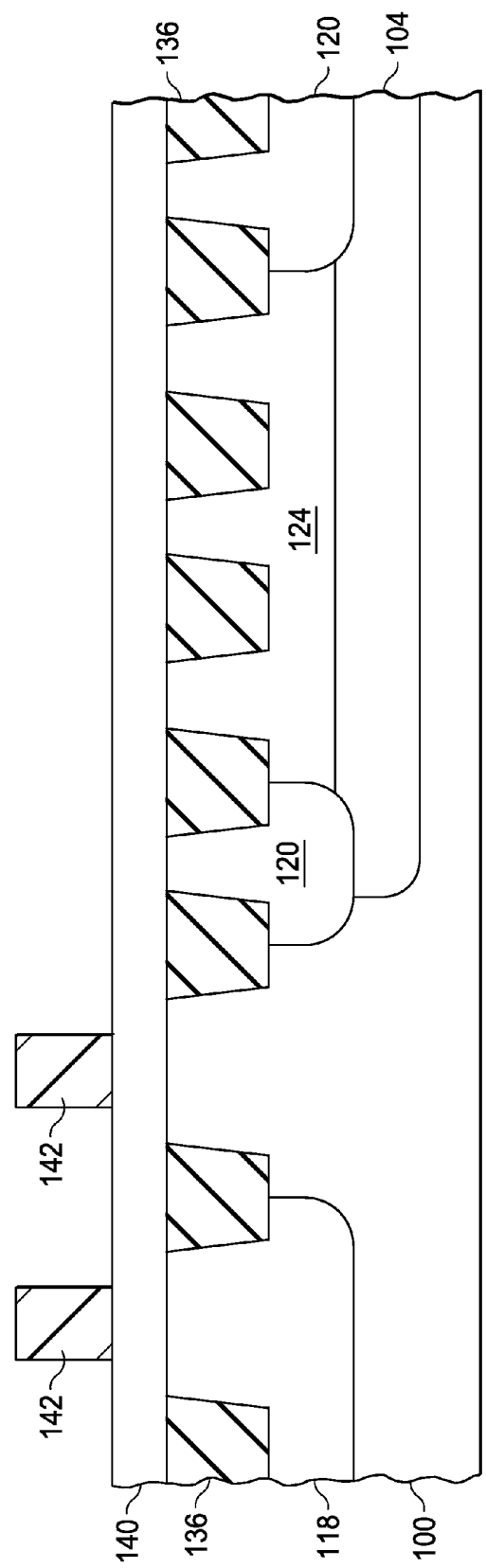
Figure 1F:
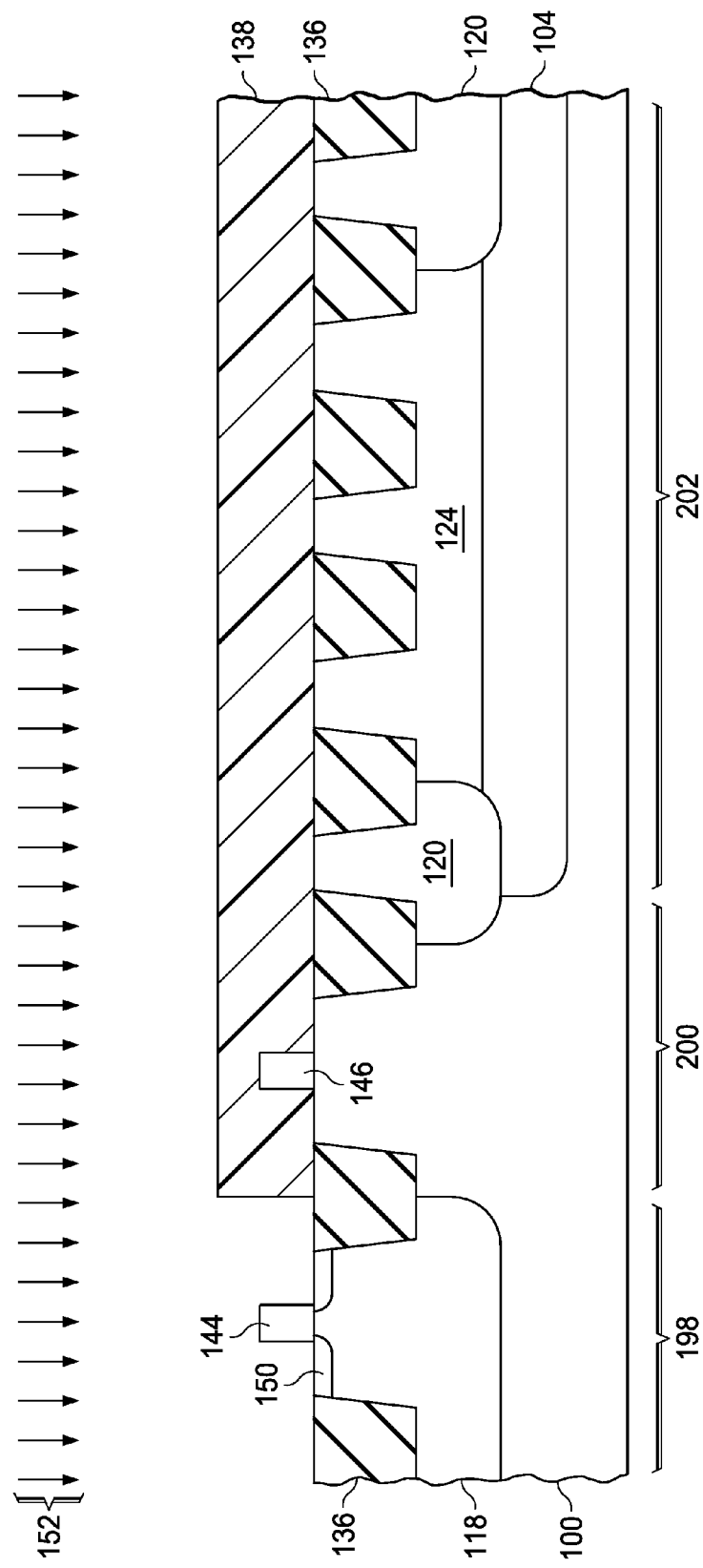
Figure 1G:
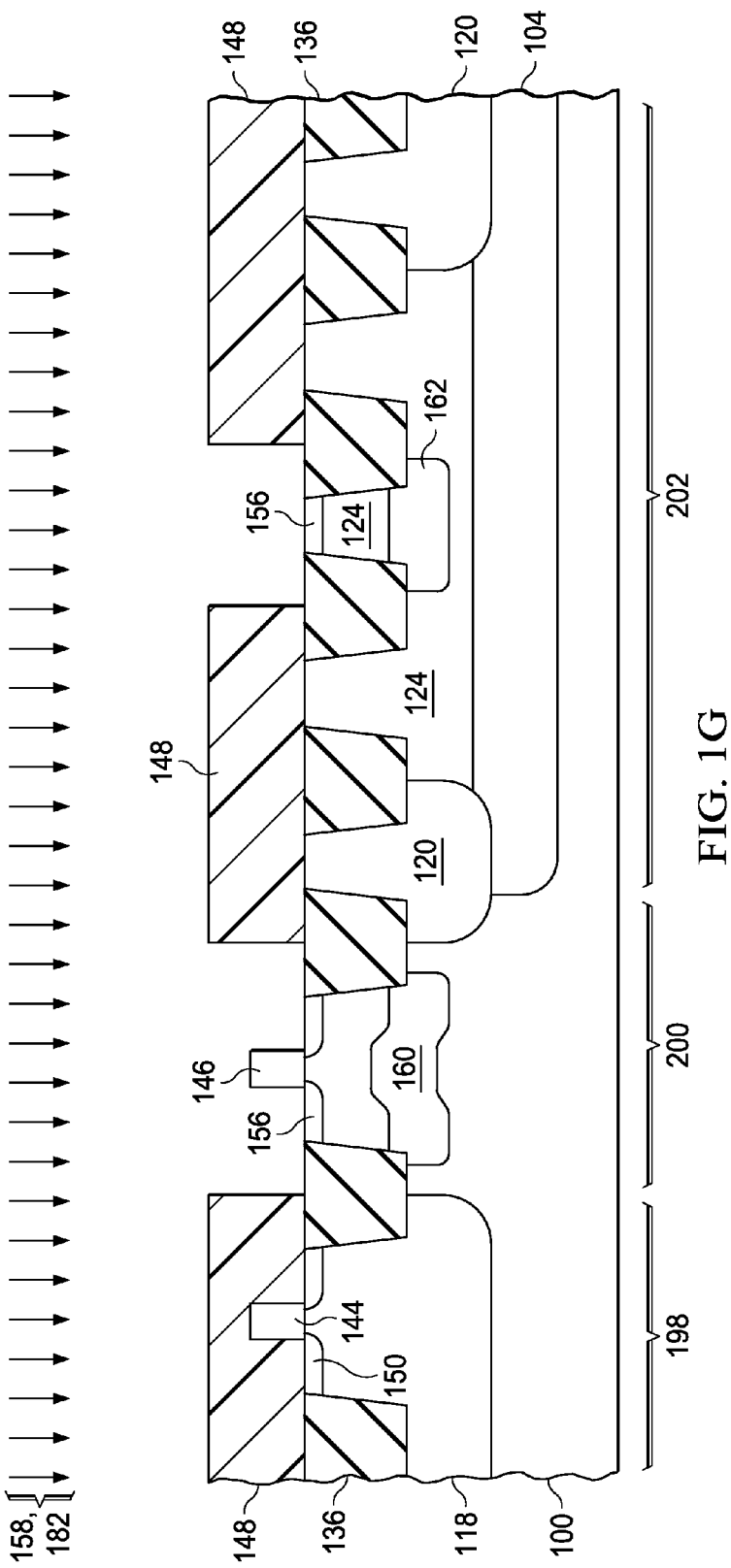
Figure 1H:
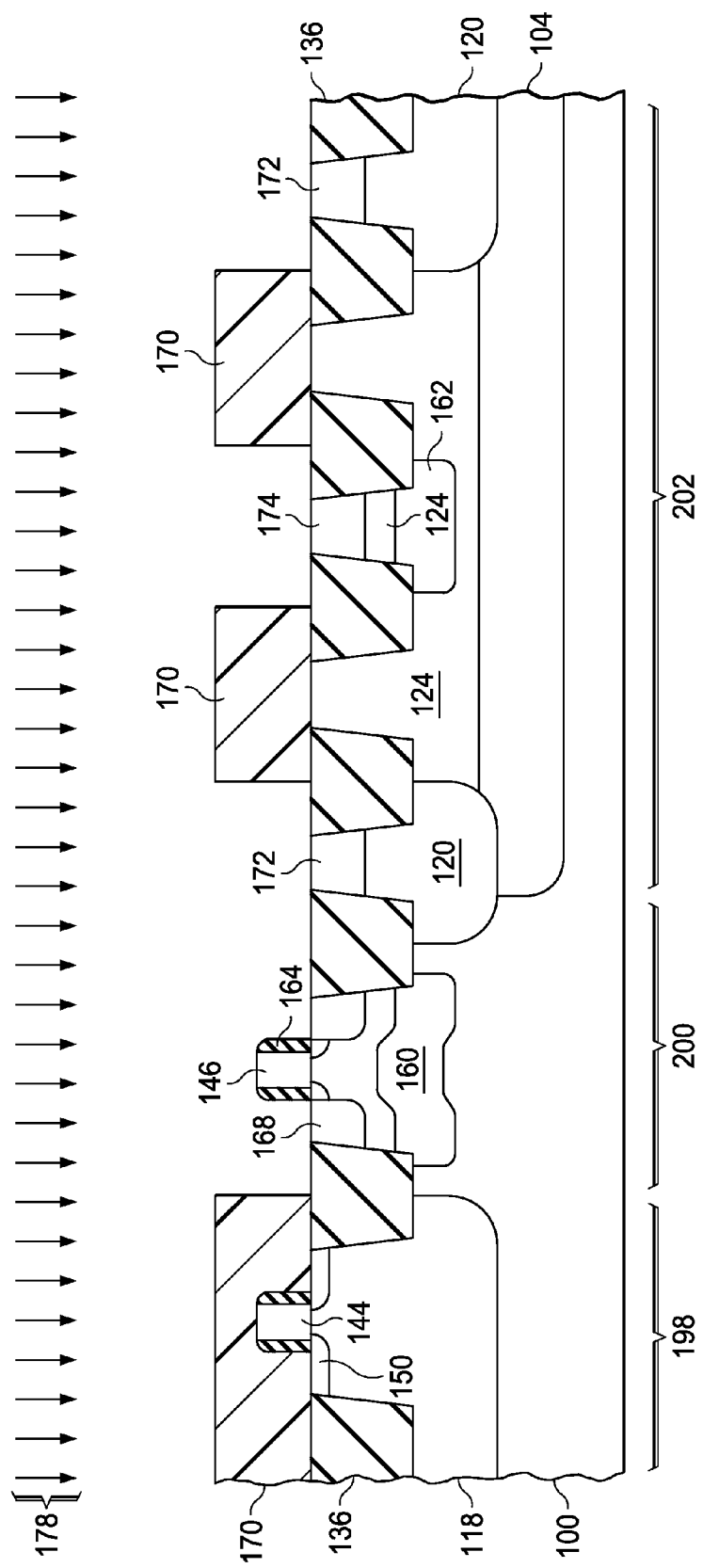
Figure 1I:
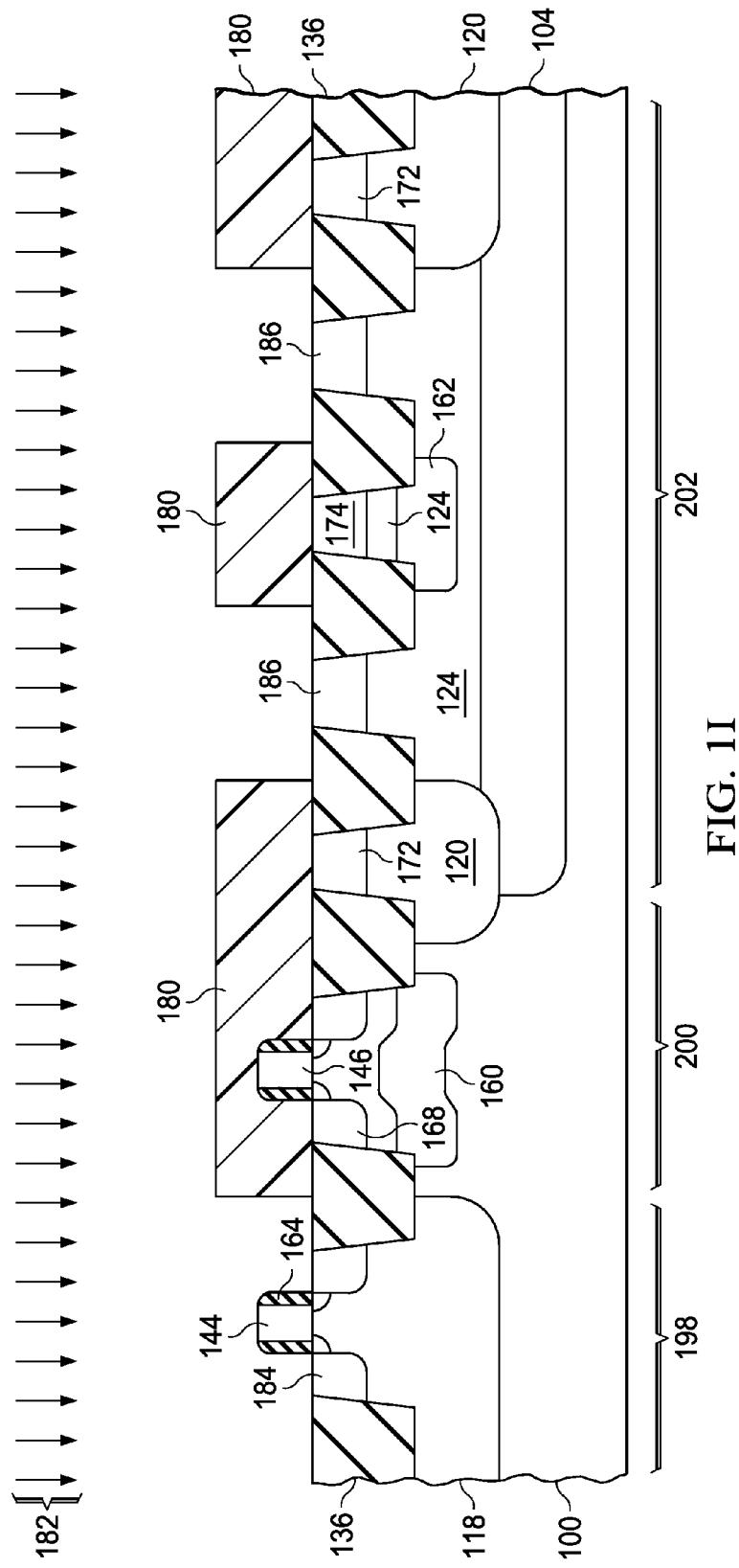
Figure 1J:
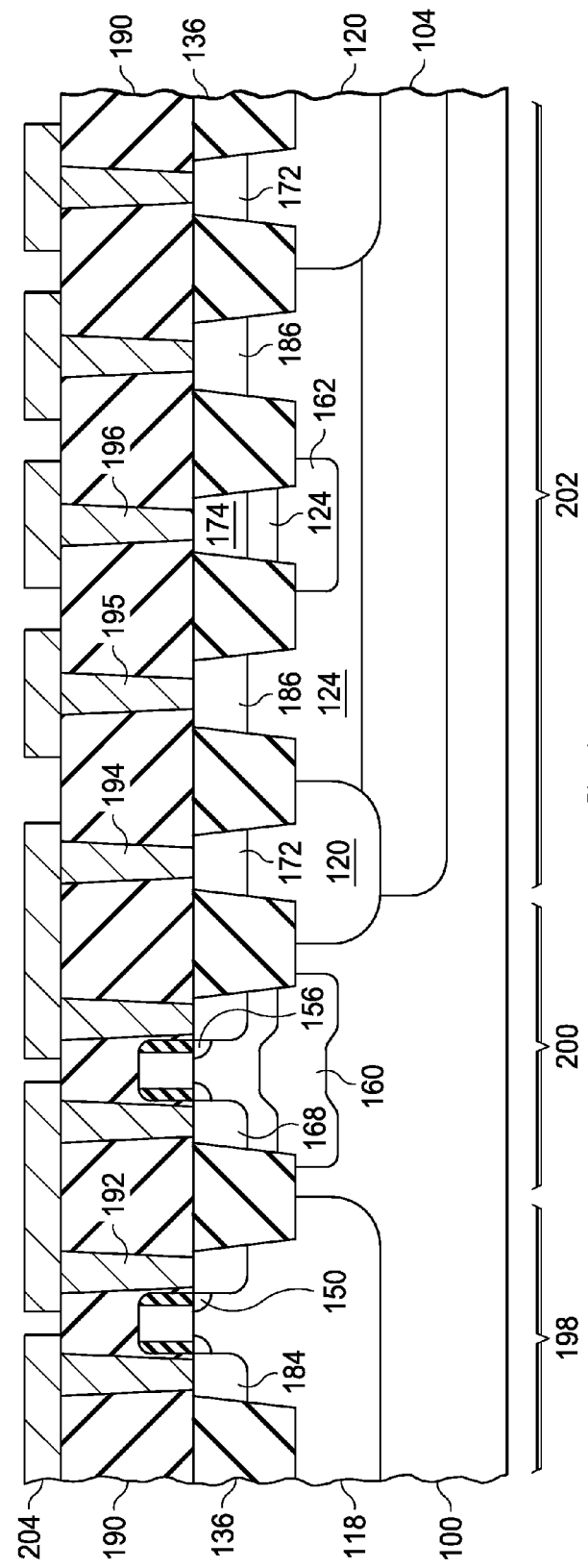

A CMOS integrated circuit with an embodiment deep collector vertical bipolar transistor is illustrated in FIG. 1J. The integrated circuit in FIG. 1J contains a p-type metal-oxide-semiconductor (PMOS) transistor 198, an n-type metal-oxide-semiconductor (NMOS) transistor 200, and an embodiment deep collector vertical bipolar NPN transistor 202. The improved deep collector vertical bipolar transistor may be formed with no additional lithography process steps.

The embodiment deep collector vertical bipolar NPN transistor 202 is formed in lightly doped p-type substrate 100. The lightly doped p-type substrate 100 may be lightly doped p-type epi on a more heavily doped p-type single crystal silicon wafer. A deep n-type diffusion (deep nwell) forms the deep collector 104 of the embodiment deep collector vertical NPN bipolar transistor 202. An N+ diffusion 174 formed simultaneously with the NMOS source and drain diffusions 168 forms the emitter 174 of the embodiment deep collector vertical bipolar NPN transistor 202. The base 124 is formed using a portion of the lightly doped p-type layer 100 that is electrically isolated from the substrate 100 by the collector diffusion 104 and by nwell diffusions 120 which are formed simultaneously with the nwell 118 of the PMOS transistor 198. An embodiment p-type base tuning diffusion 162 is added to improve transistor characteristics of the embodiment deep collector vertical NPN bipolar transistor. Doping in the base tuning diffusion 162 may be independently adjusted to optimize the tradeoff between the breakdown voltage (BVceo) and gain (hfe) of the embodiment deep collector vertical NPN bipolar transistor. The base tuning diffusion 162 may be added to the baseline CMOS integrated circuit flow without an additional lithography step. The p-type base tuning diffusion 162 is implanted using the NMOS transistor extension 156 (NLDD) implant pattern.

The base tuning p-type dopant is also implanted into the NMOS transistor region 200 forming a region 160 with increased p-type doping below the NMOS transistor 200. The region 160 of increased p-type doping is implanted sufficiently below the NMOS transistor deep source and drain diffusions 168 so that the diode capacitance and diode breakdown voltage remain within specification limits.

The embodiment deep collector vertical bipolar transistor 202 with enhanced gain is illustrated using a deep collector vertical NPN bipolar transistor. An embodiment deep collector vertical PNP bipolar transistor may also be used to illustrate the embodiment.

The major manufacturing steps illustrating building a CMOS integrated circuit with an embedded embodiment deep collector vertical NPN bipolar transistor are illustrated in FIGS. 1A-1J.

As shown in FIG. 1A, a deep nwell photo resist pattern 102 is formed on p-type substrate wafer 100. N-type dopant 106 is implanted to form the deep nwell collector 104. This diffusion 104 forms the collector of the embodiment deep collector vertical NPN bipolar transistor. An anneal may then be performed to activate the n-type dopant and to diffuse the dopant forming the deep nwell 104. The n-type dopant may have a dose in the range of 1E15 to $1E16/cm^3$. In an example embodiment the n-type dopant is phosphorus with a dose of about $8E15/cm^3$.

An nwell photo resist pattern 114 is added as shown in FIG. 1B and n-type dopant 116 is implanted to form an nwell 118 where the PMOS transistor is to be formed. The n-type implant 116 also forms nwell, 120, that forms electrical contact to the deep nwell collector 104. The nwell diffusion 120 surrounds the base 124 and electrically isolates it from the p-type substrate 100. The n-type nwell dopant may have a dose in the range of 1E12 to $1E13/cm^3$. In an example embodiment the n-type nwell dopant is phosphorus with a dose of about $3E12/cm^3$.

Referring now to FIG. 1C a shallow trench isolation (STI) photo resist pattern 130 is formed on the integrated circuit and STI trenches 132 are etched into the wafer.

In FIG. 1D the integrated circuit is shown after the STI trenches are filled with STI dielectric 136. The STI dielectric 136 overfill is removed using chemical mechanical polish (CMP) forming a planarized surface on the integrated circuit.

In FIG. 1E a gate dielectric layer is formed on the integrated circuit and transistor gate material 140 is deposited on the gate dielectric. Polysilicon gate material 140 is used to illustrate the embodiment, but metal gate first or metal replacement gate may also be used for illustration. A gate photo resist pattern 142 is formed on the transistor gate material 140.

In FIG. 1F the polysilicon is etched to form the PMOS transistor 198 gate 144 and the NMOS transistor 200 gate 146. A PMOS extension photo resist pattern 138 is then formed on the integrated circuit. A p-type dopant 152 such as boron or $BF_2$ is implanted to form source and drain extensions 150 on the PMOS transistor 198. An n-type dopant angled implant may also be implanted to form halo diffusions on the PMOS transistor 198.

A NMOS extension photo resist pattern 148 is formed on the integrated circuit in FIG. 1G. N-type dopants 158 such as arsenic and phosphorus are implanted to form the source and drain extensions 156 on the NMOS transistor 200. A p-type dopant may also be implanted at an angle to form halo diffusions on the NMOS transistor 200.

Using the NMOS extension photo resist pattern 148, p-type dopant 182 is implanted into the base 124 of the embodiment deep collector vertical NPN bipolar transistor 202 to form the embodiment base tuning diffusion 162. The concentration and energy of the base tuning dopant 182 may be adjusted to provide the best tradeoff between BVceo and hfe of the bipolar transistor 202. The p-type base tuning implant may have a dose in the range of 1E12 to $1E13/cm^3$ implanted with an energy in the range of 60 keV to 140 keV. In an example embodiment deep collector vertical NPN bipolar transistor the p-type base tuning implant has a dose of about $3E12/cm^3$ implanted with an energy of about 95 keV.

The p-type dopant is also implanted through the gate 146 into the NMOS transistor 200 area forming a base tuning diffusion 160 under the NMOS transistor 200. The energy of the p-type implant 182 is high to put the base tuning diffusion 160 sufficiently below the NMOS transistor so that diode capacitance and diode breakdown remain within specification limits.

Referring now to FIG. 1H, dielectric sidewalls 164 are formed on the vertical sides of the transistor gates 144 and 146 using well known methods. An NSD photo resist pattern 170 is formed on the integrated circuit and n-type dopants 182 such as phosphorus and arsenic are implanted into the NMOS transistor region 200 to form the NMOS transistor deep source and drain (NSD) diffusions 168.

The NSD implants 178 are also implanted into embodiment deep collector vertical NPN bipolar transistor 202 region to form substrate contact diffusion 172 to the nwell, 120. The NSD implant also forms the emitter diffusion 174 of the embodiment deep collector vertical NPN bipolar transistor.

In FIG. 1I, PSD photo resist pattern 180 is formed on the integrated circuit and p-type dopants 182 such as boron and $BF_2$ are implanted to form the PMOS transistor 198 deep source and drain diffusions (PSD) 184.

The PSD dopants 182 are also implanted into the embodiment deep collector vertical NPN bipolar transistor 202 to form contact diffusion 186 to the base 124.

The integrated circuit is shown in FIG. 1J after premetal dielectric (PMD) 190 is deposited and planarized and contact plugs 192 are formed through the PMD 190 to form an electrical connection between the transistor diffusions, 184 and 168, and the first level of interconnect 204. Contact plugs 194, 195, and 196 form electrical connection between the embodiment bipolar transistor diffusions, 172, 174, and 186, and the first level of interconnect 204.

Additional levels of dielectric and interconnect may be added to complete the integrated circuit.

Those skilled in the art to which this invention relates will appreciate that many other embodiments and variations are possible within the scope of the claimed invention.

What is claimed is:

1. A process of forming an integrated circuit, comprising the steps:

providing a substrate wafer with a first doping type;

implanting a first implant of a second doping type to form a deep well in the substrate wafer wherein the deep well forms a collector of a deep collector vertical bipolar transistor;

implanting a second implant of the second doping type to form a first well in the substrate wafer wherein the first well contacts the deep well and electrically isolates a base region of the deep collector vertical bipolar transistor from the substrate;

implanting the second implant to form a second well in the substrate wherein the second well forms a body of a MOS transistor;

forming a MOS transistor gate dielectric;

forming a MOS transistor gate on the MOS transistor gate dielectric;

implanting a third implant of the second doping type to form source and drain diffusions self aligned to the MOS transistor gate;

implanting the third implant to form an emitter of the deep collector vertical bipolar transistor;

implanting a fourth implant of the first doping type to form a first base tuning diffusion within the base of the deep collector vertical bipolar transistor; and implanting the fourth implant to form a second base tuning diffusion under the gate of the MOS transistor gate and under the source and drain diffusions.

2. The process of claim 1, wherein the first doping type is p-type, the second doping type is n-type, the MOS transistor is an NMOS transistor and the deep collector vertical bipolar transistor is a deep collector vertical NPN bipolar transistor.

3. The process of claim 1, wherein the fourth implant is boron with a dose in the range of $1E12/cm^2$ and $1E13/cm^2$.

4. The process of claim 1, wherein the fourth implant is boron with a dose between $1E12/cm^3$ and $1E13/cm^3$ with an energy between 60 keV and 140 keV.

5. The process of claim 1, wherein the first doping type is n-type, the second doping type is p-type, the MOS transistor is a PMOS transistor and the deep collector vertical bipolar transistor is a deep collector vertical PNP bipolar transistor.

6. The process of claim 5, wherein the fourth implant is phosphorus with a dose in the range of $1E12/cm^2$ and $1E13/cm^2$.

7. The process of claim 5, wherein the fourth implant is phosphorus with a dose between $1E12/cm^3$ and $1E13/cm^3$ with an energy between 60 keV and 140 keV.

8. A process of forming an integrated circuit, comprising the steps:
providing a p-type substrate wafer;
implanting phosphorus to form a deep nwell wherein the deep nwell forms a collector of a deep collector vertical NPN bipolar transistor;
implanting phosphorus dopant to form an nwell in the p-type substrate wafer wherein the nwell forms electrical contact to the deep nwell and surrounds a p-type base region of the deep collector vertical NPN bipolar transistor;
forming a transistor gate dielectric;
forming an NMOS transistor gate on the transistor gate dielectric;
implanting at least one of arsenic and phosphorus to form NMOS source and drain diffusions self aligned to the NMOS transistor gate and to form an emitter of the deep collector vertical NPN bipolar transistor; and
implanting boron to form a first base tuning diffusion within the p-type base of the deep collector vertical NPN bipolar transistor and to form a second base tuning diffusion under the NMOS transistor gate and under the NMOS source and drain diffusions.

9. The process of claim 8, wherein a concentration of boron in the first and second tuning diffusion implants is in the range of $1E12/cm^3$ and $1E13/cm^3$.

10. The process of claim 8, wherein a concentration of boron in the first and second tuning diffusion implants is between $1E12/cm^3$ and $1E13/cm^3$ implanted with an energy between 60 keV and 140 keV.

11. A process of forming an integrated circuit, comprising the steps:
providing an n-type substrate wafer;
implanting boron to form a deep pwell wherein the deep pwell forms a collector of a deep collector vertical PNP bipolar transistor;
implanting boron dopant to form a pwell in the n-type substrate wafer wherein the pwell forms electrical contact to the deep pwell and surrounds an n-type base region of the deep collector vertical PNP bipolar transistor;
forming a transistor gate dielectric;
forming a PMOS transistor gate on the transistor gate dielectric;
implanting at least one of boron and $BF_2$ to form PMOS source and drain diffusions self-aligned to the PMOS transistor gate and to form an emitter of the deep collector vertical PNP bipolar transistor; and
implanting phosphorus to form a first base tuning diffusion within the n-type base of the deep collector vertical PNP bipolar transistor and to form a second base tuning diffusion under the PMOS transistor gate and under the PMOS source and drain diffusions.

12. The process of claim 8, wherein a concentration of phosphorus in the first and second tuning diffusion implants is in the range of $1E12/cm^3$ and $1E13/cm^3$.

13. The process of claim 8, wherein a concentration of phosphorus in the first and second tuning diffusion implants is between $1E12/cm^3$ and $1E13/cm^3$ implanted with an energy between 60 keV and 140 keV.

\* \* \* \* \*